(12) United States Patent
Buchwald

(10) Patent No.: US 7,449,886 B2
(45) Date of Patent: Nov. 11, 2008

(54) MR RECEIVER ASSEMBLY HAVING READOUT CABLES CAPABLE OF MULTIPLE CHANNEL TRANSMISSIONS

(75) Inventor: Randall H. Buchwald, Waukesha, WI (US)

(73) Assignee: General Electric Company, Schenectady, NY (US)

(*) Notice: Subject to any disclaimer, the term of this patent is extended or adjusted under 35 U.S.C. 154(b) by 359 days.

(21) Appl. No.: 10/904,613

(22) Filed: Nov. 18, 2004

(65) Prior Publication Data

US 2006/0103386 A1    May 18, 2006

(51) Int. Cl.
*G01V 3/00* (2006.01)

(52) U.S. Cl. .................... 324/311; 324/318; 324/322

(58) Field of Classification Search ......... 324/318–322; 174/35 R, 363
See application file for complete search history.

(56) References Cited

U.S. PATENT DOCUMENTS

| | | | |
|---|---|---|---|
| 2,744,159 A * | 5/1956 | Wright et al. ............... 370/524 |
| 2,984,781 A * | 5/1961 | Schwede .................... 324/301 |
| 4,763,074 A * | 8/1988 | Fox ............................ 324/314 |
| 4,825,162 A * | 4/1989 | Roemer et al. ............. 324/318 |
| 4,885,538 A * | 12/1989 | Hoenniger et al. ......... 324/312 |
| 4,947,121 A * | 8/1990 | Hayes ......................... 324/322 |
| 5,160,891 A * | 11/1992 | Keren ......................... 324/318 |
| 5,245,288 A | 9/1993 | Leussler |
| 5,351,688 A * | 10/1994 | Jones ......................... 600/422 |
| 5,370,118 A * | 12/1994 | Vij et al. ..................... 600/422 |
| 5,384,536 A | 1/1995 | Murakami et al. |
| 5,471,142 A * | 11/1995 | Wang .......................... 324/318 |
| 5,529,068 A * | 6/1996 | Hoenninger et al. ........ 600/413 |
| 5,572,130 A * | 11/1996 | Ratzel ......................... 324/318 |
| 5,786,782 A * | 7/1998 | Ostman et al. .............. 341/141 |
| 5,861,749 A * | 1/1999 | Van Heelsbergen ......... 324/322 |
| 5,951,474 A * | 9/1999 | Matsunaga et al. .......... 600/422 |
| 6,104,943 A * | 8/2000 | Frederick et al. ............ 600/410 |
| 6,160,398 A * | 12/2000 | Walsh ......................... 324/309 |
| 6,249,121 B1 * | 6/2001 | Boskamp et al. ............ 324/318 |
| 6,351,124 B1 * | 2/2002 | Vester et al. ................ 324/318 |
| 6,356,081 B1 * | 3/2002 | Misic .......................... 324/318 |
| 6,377,044 B1 * | 4/2002 | Burl et al. ................... 324/307 |
| 6,501,274 B1 * | 12/2002 | Ledden ....................... 324/318 |
| 6,549,799 B2 * | 4/2003 | Bock et al. .................. 600/422 |
| 6,633,162 B2 * | 10/2003 | Zhang et al. ................ 324/322 |

(Continued)

OTHER PUBLICATIONS

Huq SB and Goldie J, "An Overview of LVDS Technology", National Semiconductor Application Note 971, Jul. 1998.*

(Continued)

*Primary Examiner*—Brij B. Shrivastav
*Assistant Examiner*—Tiffany A Fetzner
(74) *Attorney, Agent, or Firm*—Ziolkowski Patent Solutions Group, SC

(57) ABSTRACT

An RF receiver apparatus for translating multiple channels of MR data across a single readout cable is disclosed. The RF receiver apparatus is designed to separately translate In-phase and Quadrature components of an MR signal to a data acquisition system for signal processing. Moreover, multiple channels of In-phase and Quadrature signals may be transmitted as composite signals to the data acquisition system across a single coaxial cable. The composite signals may then be filtered to recover the multiple channels of data. The RF receiver apparatus is particularly applicable with a phased-array coil architecture.

22 Claims, 4 Drawing Sheets

U.S. PATENT DOCUMENTS

| | | | |
|---|---|---|---|
| 6,664,465 B2 * | 12/2003 | Seeber | 174/363 |
| 6,751,496 B2 * | 6/2004 | Su et al. | 600/422 |
| 6,768,302 B2 * | 7/2004 | Vester | 324/307 |
| 6,771,067 B2 * | 8/2004 | Kellman et al. | 324/307 |
| 6,774,624 B2 * | 8/2004 | Anderson et al. | 324/207.17 |
| 6,870,368 B2 * | 3/2005 | Visser et al. | 324/318 |
| 6,998,842 B2 * | 2/2006 | Sinnema et al. | 324/318 |
| 7,012,429 B1 * | 3/2006 | Ledden | 324/318 |
| 2002/0125888 A1 * | 9/2002 | Visser et al. | 324/318 |
| 2002/0156362 A1 * | 10/2002 | Bock et al. | 600/410 |
| 2002/0167315 A1 * | 11/2002 | Kellman et al. | 324/307 |
| 2003/0058502 A1 * | 3/2003 | Griffiths et al. | 359/152 |
| 2003/0062894 A1 * | 4/2003 | Vester | 324/307 |
| 2003/0062901 A1 * | 4/2003 | Zhang et al. | 324/322 |
| 2003/0209354 A1 * | 11/2003 | Seeber | 174/35 R |
| 2004/0068161 A1 * | 4/2004 | Couvillon, Jr. | 600/143 |
| 2004/0155656 A1 * | 8/2004 | Leussler | 324/318 |
| 2005/0033152 A1 * | 2/2005 | Sinnema et al. | 600/410 |
| 2005/0104590 A1 * | 5/2005 | Sinnema et al. | 324/318 |
| 2006/0103386 A1 * | 5/2006 | Buchwald | 324/322 |

OTHER PUBLICATIONS

Levitt MH, Spin Dynamics, Jon Wiley and Sons Ltd, West Sussex, England, 2001; pp. 585-588.*

Scott et al., Wireless Transponders for Parallel MRI: Systems Issues, Second International Workshop on Parallel Imaging, Latsis Symposium 2004, Oct. 15-17, 2004.

* cited by examiner

MR RECEIVER ASSEMBLY HAVING READOUT CABLES CAPABLE OF MULTIPLE CHANNEL TRANSMISSIONS

BACKGROUND OF THE INVENTION

The present invention relates generally to magnetic resonance (MR) imaging systems and, more particularly, to an RF receiver assembly capable of translating multiple channels of MR signals across a single readout cable. The present invention is particularly applicable with multi-coil architectures.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received by a receive coil(s) and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

An RF coil assembly having one or more receive coils is used to sample the "echo" induced by application of magnetic field gradients and excitation pulses. Each receive coil samples the echo or MR signal and transmits the signal to a receive channel or a receive channel stack. Each receive channel then translates the acquired signal to a processing system that formats the signal into a data stream that is fed to a data acquisition system (DAS) for image reconstruction. Generally, there is a desire to increase the number of receive coils that are used to sample the induced echo. Simply put, increasing the number of coils increases overall system sensitivity to the induced echo signal. However, as the number of receive coils is added to an MR system, the need for additional parallel receiving channels also increases. The number of coils that can be implemented is not limitless as physical constraints limit the number of readout cables that can be connected between the coils and the receiver hardware of the MR system. As a result, the MR system is equipped with fewer receive coils than may be desired. This can be problematic given sensitivity to a region-of-interest (ROI) is partly the result of the number of receive coils of the MR system.

Additionally, the parallel readout cables used to translate received signals from a scan subject are typically routed in relatively large bundles from the coils to the receiver channels or hardware. As each coil is connected to the receiver hardware via a unique readout cable, any increase in the number of coils also increases the number of readout cables required. Further, there are physical limitations as to the number of receivers that can be provided within a given receiver cabinet of an MR system, which further limits the potential number of cables and receivers that may be used in constructing an MR system.

It would therefore be desirable to have a system capable of routing multiple channels of MR data across a single readout cable. It would also be desirable to process acquired signals to utilize the receiver and transport channels of an MR system more efficiently.

BRIEF DESCRIPTION OF THE INVENTION

The present invention provides a system of translating multiple channels of MR data across a single readout cable that overcomes the aforementioned drawbacks.

An RF receiver assembly is presented and has readout cables, each capable of transmitting multiple channels of MR data thereacross. Frequency-division multiplexing is used to divide the available bandwidth of a readout cable into multiple channels. Each channel is then used to transmit frequency offset data for signal processing The receiver assembly also has channel combiners designed to generate a single composite signal from multiple channels of MR signals that can be processed, filtered, and formatted for inputting to the system DAS. Once received, the DAS digitally processes the composite signal to recover the individual channels of MR data. The receiver assembly preferably includes an In-phase (I-phase) readout cable and a Quadrature (Q-phase) readout cable so that I-phase components are transmitted separately from Q-phase components.

Therefore, in accordance with one aspect of the present invention, an MR signal receiver apparatus includes a plurality of RF coils. Each RF coil is configured to sample an echo excited by an excitation pulse and encoded by at least one gradient field, and output a channel of MR data. The apparatus further has a readout cable operationally connected to the plurality of RF coils and configured to translate multiple channels of MR data thereacross.

In accordance with another aspect, the present invention includes an MR imaging system having an MR imaging apparatus that has a plurality of gradient coils positioned about a bore of a magnet to impress a polarizing magnetic field and an RF transceiver system and an RF switch controlled by a pulse module to transmit RF signals to an RF coil assembly to acquire MR images. The RF coil assembly includes a number of mixers, each designed to segment an MR signal into I-phase components and Q-phase components. The coil assembly further has an I-channel combiner configured to receive multiple channels of I-phase components and a Q-phase channel combiner configured to receive multiple channels of Q-phase components. An I-channel readout cable is connected to the I-channel combiner and configured to translate the multiple channels of I-phase components thereacross and a Q-channel readout cable connected to the Q-channel combiner and configured to translate the multiple channels of Q-phase components thereacross.

According to another aspect, the present invention includes a method of MR imaging comprising the steps of acquiring multiple channels of MR signals from a subject to be imaged and transmitting the multiple channels of MR signals to a receive channel signal processor across a single cable.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
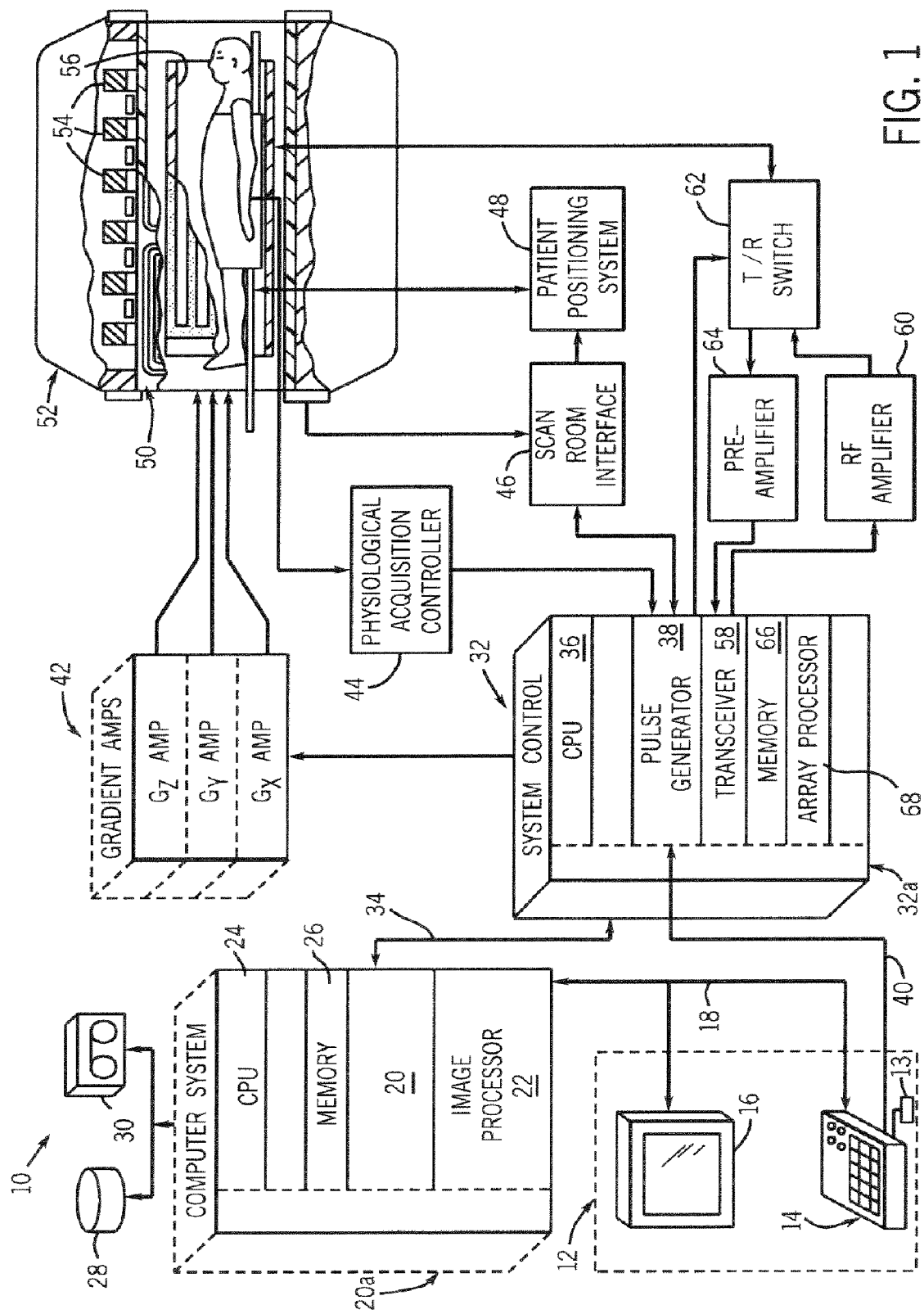
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

Figure 2:
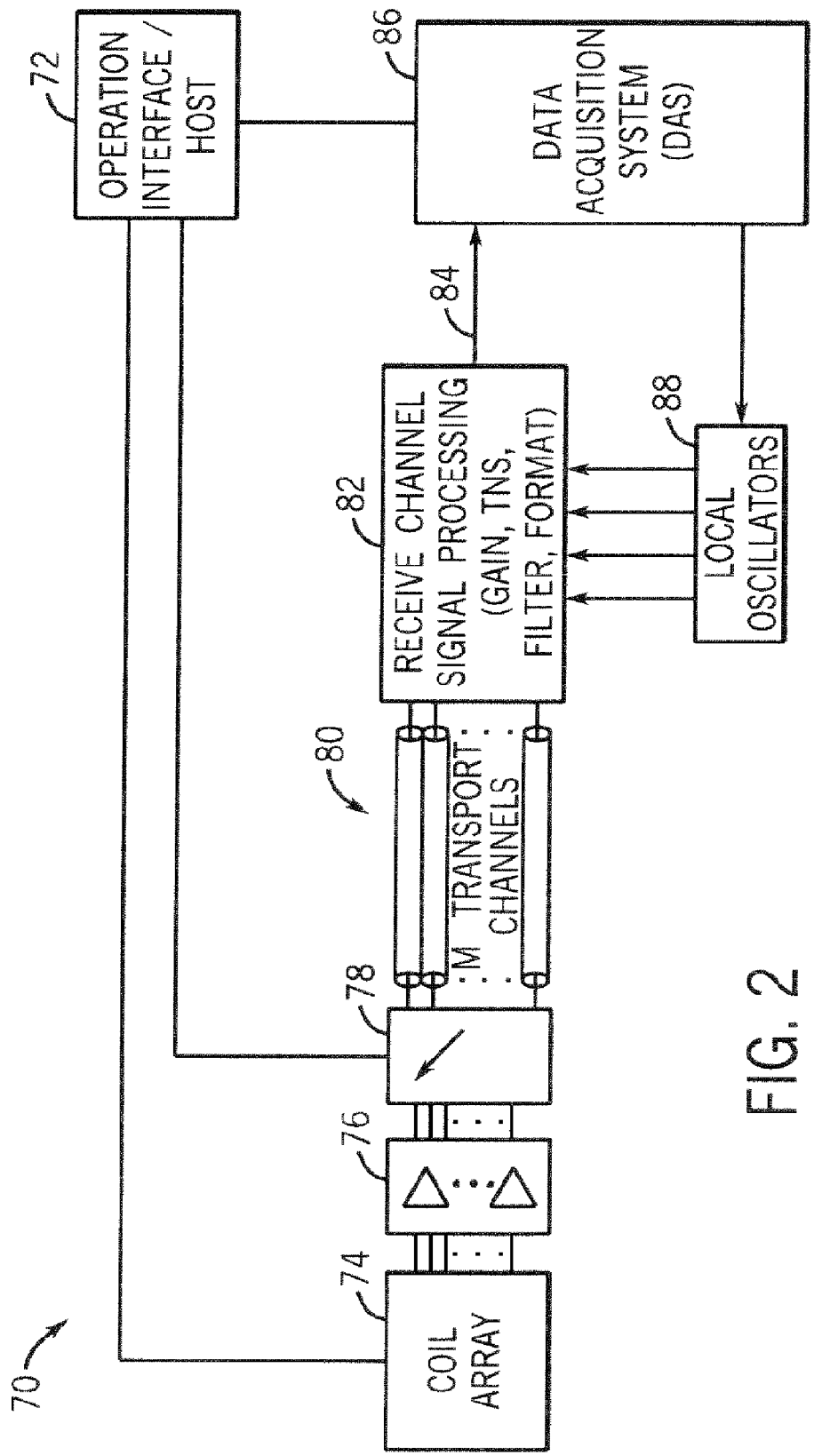
FIG. 2 is a schematic block diagram of a receive chain subsystem applicable with the MR imaging system of FIG. 1.

The present invention is directed to a receive chain subsystem applicable with the MRI system illustrated in FIG. 1. The receive chain subsystem 70, as schematically shown in FIG. 2, is defined by an operator interface/host 72 that controls operation of the receive chain subsystem components. Subsystem 70 includes a number of receiver channels 74 which may include an integrated preamplifier 76. The receiver channels are designed to receive signals from a plurality of coil elements, such as a phased-array coil architecture, head coil, body coil, and the like. Subsystem 70 also includes a transport channel selection switch assembly 78 that is controlled by the operator interface/host 72 to control the read out of data from the receiver channels. The signals received by the receiver channels are then transmitted via transport channels 80 for downstream signal processing. In one embodiment, each transport channel has a signal bandwidth of 1 MHz. Other signal bandwidths are also possible. The transport channels 80 translate the signals received from the receive coils of the MR system to various signal processing components, schematically represented as block 82, that process the data for transmission in a data stream 84 to DAS 86. The various components include those implemented for transient noise suppression, gain control, bandpass filtering, analog to digital conversion, and data stream formatting.

Subsystem 70 interfaces with a number of other subsystems of the MR system including front end power supply sources, coil presence/identification communication subsystem, channel selection control, penetration panel physical I/O, transmitter subsystem frequency/phase synchronization, channel dynamic range control, data decimation/filter selection control, and data stream transport to the system DAS.

Subsystem 70 is also designed to translate multiple channels of MR data or signals across a single readout cable. As will be described, frequency-division multiplexing is implemented to provide a composite signal of the multiple channels of data using a frequency offset such that all the channels are transported across a common cable. As will be described, each channel will be centered about a frequency that is unique relative to the other channels. Once this composite signal is transmitted across a corresponding transport channel 80, it is processed in a manner to recover the individual channels of data. In this regard, the receive chain subsystem 70 also interfaces with local oscillators 88. The oscillators 88 together with a phase locked carrier maintain system frequency and phase coherence during recovery of the individual channels of data. A coil arrangement 90 samples an encoded echo 92 that is induced through the application of magnetic gradient and RE pulses in a conventional manner. The echo signal 92 is then input to a preamplifier 94 through the control of a transmit/receive switch 96. In this regard, the coils 90 may be transmit as well as receive coils. As such, the switch opens the transmit circuit and closes the receive circuit during echo readout.

The amplified echo signal 98 is fed to a programmable gain amplifier 100 and then input to a pair of image-reject mixers 102, 104. Image-reject mixers 102, 104 operate to segment out the I-phase and Q-phase components of amplified echo signal 98 from one another. Local oscillator signals 106 and 108 are fed to mixers 102 and 104, respectively, through low voltage differential signaling (LVDS). Implementing image-reject mixers 102 and 104 alleviates the need for image reject filters. The output of each mixer 102, 104 is then filtered using respective low pass filters 110, 112. As a result, filtered I-phase and Q-phase signals 114, 116 are output. The signals are then separately transported for subsequent signal processing on a common cable. More particularly, the I-phase signals are transported on one cable and the Q-phase signals are transported on another cable.

Figure 3:
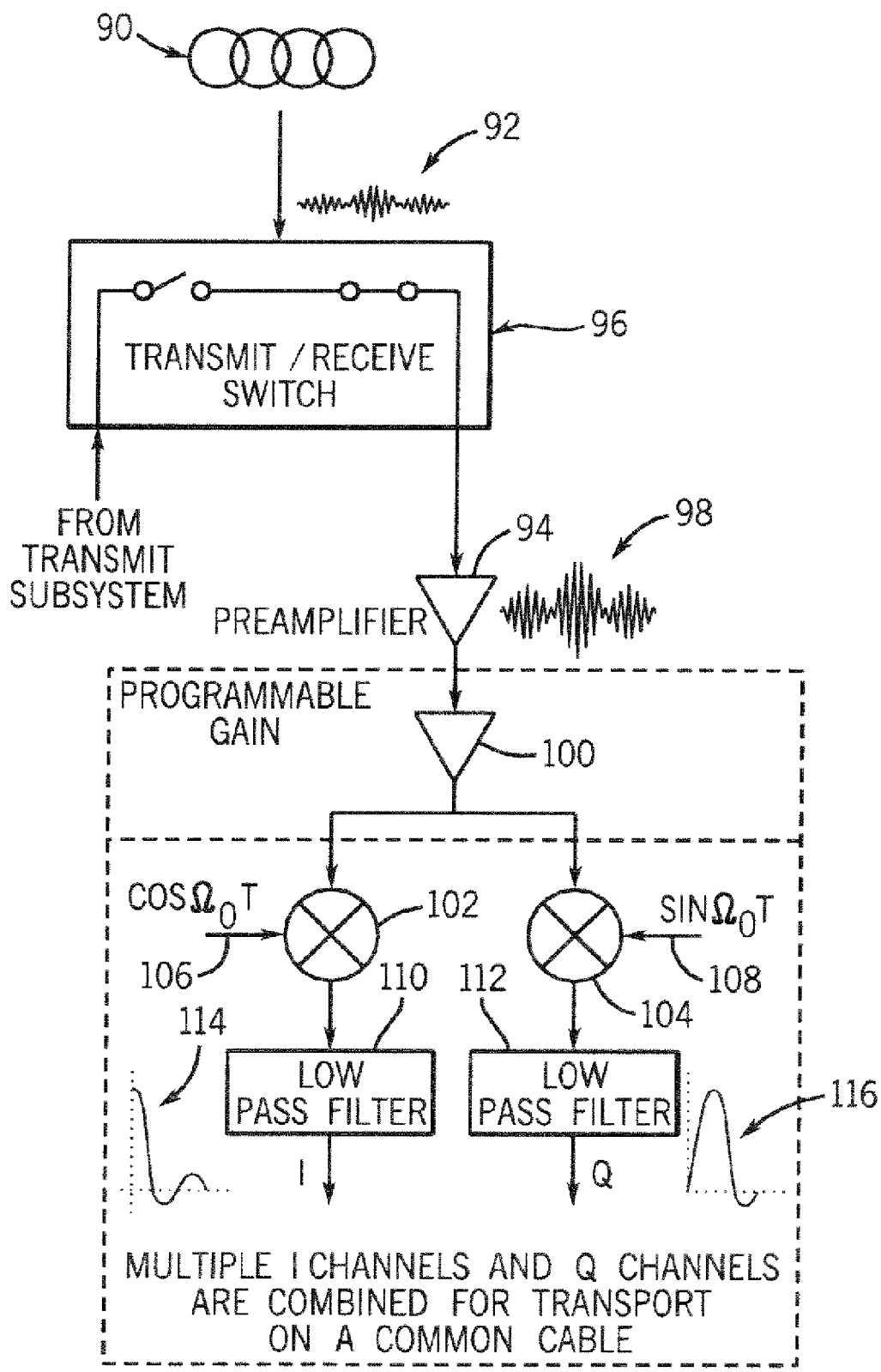
FIG. 3 is a schematic block diagram of an echo sampling and processing system according to the present invention.
Figure 4:
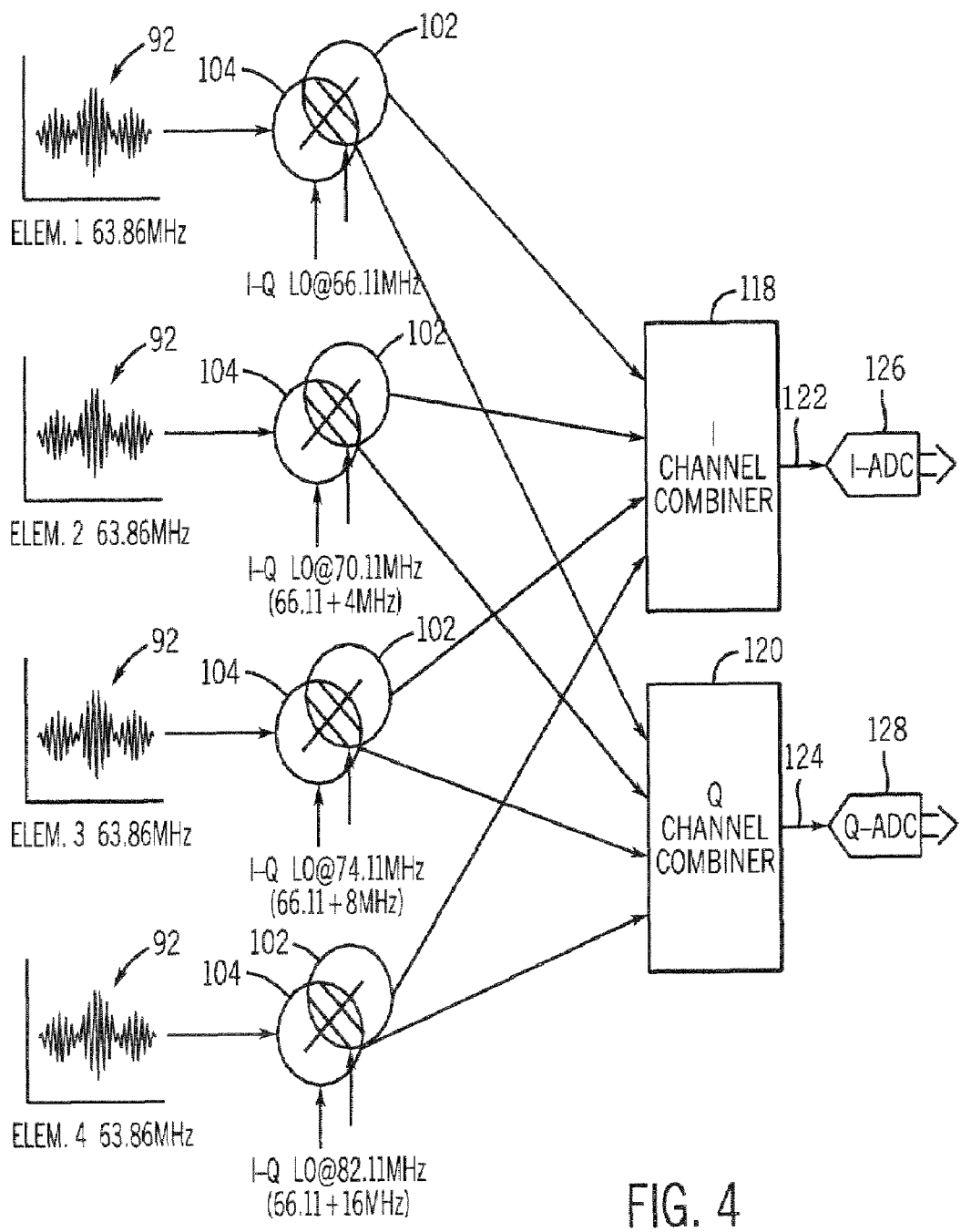
FIG. 4 is a schematic block diagram of a frequency-division multiplexing system according to the present invention.

Referring now to FIG. 4, the present invention is particularly applicable with multi-coil RF coil assemblies and, as such, the application of local oscillator signals to segment out I-phase and Q-phase components as described with respect to FIG. 3 is carried out on the signal acquired by each coil of a multi-coil assembly. In this regard, the output of each coil element is input to an image-reject mixer that will separate the fundamental components in the signal from one another. These component signals are then transmitted separately from one another. For a multi-coil arrangement, the In-phase and Quadrature components signals are fed to a corresponding channel combiner 118, 120. As shown in FIG. 4, each coil element samples an echo 92 to acquire an MR signal at a defined frequency, e.g. 63.86 MHz. Each MR signal, after preamplification, is input to a pair of image-reject mixers 102, 104. The image-reject mixers 102, 104 are driven by a local oscillator with a frequency offset. The frequency offset is used to differentiate In-phase and Quadrature component signals corresponding to one coil from that of another coil. In one preferred embodiment, for a four coil RF coil assembly, offset frequencies of 2.25 MHz, 6.25 MHz, 10.25 MHz, and 18.25 MHz are used. It is contemplated that frequencies offsets different from those listed above are possible.

Still referring to FIG. 4, the I-phase component signals are fed to an I-channel combiner 118 and the Q-phase component signals are fed to a Q-channel combiner 120. One skilled in the art will appreciate that the number of simultaneous channels that may be transmitted across a single readout cable is limited by the linearity of the channel combiners. The channel combiners 118, 120 combine the frequency-divided multiplexed signals into respective composite signals. Each composite signal 122 and 124, each of which is comprised of multiple channels of data, is then input to a respective analog-to-digital converter (ADC). More particularly, an I-channel ADC 126 receives the I-phase composite signal and a Q-channel ADC 128 receives the Q-phase composite signal 124. The ADCs 126 and 128 have a wide input bandwidth and digitize the respective composite signals for transmission to signal processing components of the receive chain subsystem. Each of the digitized composite signals is preferably translated across a single coaxial readout cable, schematically shown as 122 and 124 in FIG. 4. In this regard, each readout cable has sufficient bandwidth to transport the multiple channels of data embodied in each composite signal. In one preferred embodiment, each readout cable has a bandwidth exceeding 300 MHz. One skilled in the art will appreciate that the readout cable may also be a differential twisted pairs cable rather than a coaxial cable.

As described with respect to FIG. 2, the multiple channels of MR signals are input to various signal processing components to carry out additional processing of the MR signals. In this regard, signal processing is carried out to format the digitized signals into a high speed digital data stream that is fed to the scanner's DAS. The DAS then recovers the individual channels of data in the data stream through digital bandpass filtering and decimating using numerically controlled oscillators. The oscillators and a phase locked carrier are used to maintain system frequency and phase coherence.

An MR system has been described whereby multiple channels of MR signals are transmitted across a single readout cable. Local oscillator signals are fed to image-reject mixers preferably using LVDS twisted pairs; however, non-LVDS signaling may be used. Image-reject mixing is used to segment out the I-phase and Q-phase components of an MR signal which allows each of the component signals to be individually sampled. As a result, the present invention supports digital sideband selection and thus eliminates the need for pre-mixer analog filters. Additionally, the invention heretofore described effectively doubles the sampling rate possible as the I-phase and Q-phase components are sampled separately at a full ADC sampling rate. It is also contemplated that digital signal tuning may be carried out on the channels independently. Further, the application of digital signal processing, enables tuning, filtering, decimation, and data packing of the channels of data that is not feasible with analog dependent systems.

Therefore, the present invention includes an MR signal receiver apparatus having a plurality of RF coils. Each RF coil is configured to sample an echo excited by an excitation pulse and encoded by at least one gradient field, and output a channel of MR data. The apparatus further has a readout cable operationally connected to the plurality of RF coils and configured to translate multiple channels of MR data thereacross.

The present invention also includes an MR imaging system having an MR imaging apparatus that has a plurality of gradient coils positioned about a bore of a magnet to impress a polarizing magnetic field and an RF transceiver system and an RF switch controlled by a pulse module to transmit RF signals to an RF coil assembly to acquire MR images. The RF coil assembly includes a number of mixers, each designed to segment an MR signal into I-phase components and Q-phase components. The coil assembly further has an I-channel combiner configured to receive multiple channels of I-phase components and a Q-phase channel combiner configured to receive multiple channels of Q-phase components. An I-channel readout cable is connected to the I-channel combiner and configured to translate the multiple channels of I-phase components thereacross and a Q-channel readout cable connected to the Q-channel combiner and configured to translate the multiple channels of Q-phase components thereacross.

The present invention further includes a method of MR imaging comprising the steps of acquiring multiple channels of MR signals from a subject to be imaged and transmitting the multiple channels of MR signals to a receive channel signal processor across a single cable.

The present invention has been described in terms of the preferred embodiment, and it is recognized that equivalents, alternatives, and modifications, aside from those expressly stated, are possible and within the scope of the appending claims.

What is claimed is:

1. An MR signal receiver apparatus comprising:
a plurality of RF coils, each RF coil configured to sample an echo excited by an excitation pulse and encoded by at least one gradient field, and output a channel of MR data; and
a readout cable operationally connected to the plurality of RF coils and configured to translate multiple channels of frequency-division multiplexed MR data signals thereacross.

2. The apparatus of claim 1 wherein the readout cable is further configured to translate multiple signals, each signal centered at a unique frequency.

3. The apparatus of claim 1 wherein the readout cable is further configured to translate only one of I-phase or Q-phase signals thereacross.

4. The apparatus of claim 3 further comprising an image reject mixer configured to isolate I-phase and Q-phase components from a channel of MR data.

5. The apparatus of claim 4 further comprising an I-phase channel combiner and a Q-phase channel combiner, each configured to receive corresponding signals from an image reject mixer.

6. The apparatus of claim 5 comprising an I-channel readout cable configured to translate multiple channels of I-phase signals and a Q-channel readout cable configured to translate multiple channels of Q-phase signals.

7. The apparatus of claim 4 further comprising an LVDS connection connecting a local oscillator to an image reject mixer.

8. The apparatus of claim 4 absent an analog filter upstream of the image reject mixer.

9. The apparatus of claim 1 wherein the readout cable is a coaxial cable.

10. The apparatus of claim 1 wherein the readout cable has a bandwidth of at least 300 MHz.

11. An MRI system comprising:
a magnetic resonance imaging (MRI) apparatus having a plurality of gradient coils positioned about a bore of a magnet to impress a polarizing magnetic field and an RF transceiver system and an RF switch controlled by a pulse module to transmit RF signals to an RF coil assembly to acquire MR images; and
wherein the RF coil assembly includes:
a number of mixers, each designed to segment an MR signal into an I-phase signal and a Q-phase signal;
an I-channel combiner configured to receive multiple channels of I-phase signals;
a Q-phase channel combiner configured to receive multiple channels of Q-phase signals;
an I-channel readout cable connected to the I-channel combiner and configured to translate the multiple channels of I-phase signals thereacross to a DAS;
a Q-channel readout cable connected to the Q-channel combiner and configured to translate the multiple channels of Q-phase signals thereacross to the DAS; and
wherein each readout cable is configured to translate multiple channels of signals with each channel centered about a unique frequency.

12. The MRI system of claim 11 wherein each readout cable is capable of transmitting signals with a collective bandwidth in excess of 300 MHz.

13. The MRI system of claim 11 further comprising an LVDS connection between a local oscillator and a mixer.

14. The MRI system of claim 11 wherein each mixer is configured to carry out image-reject mixing of received signals.

15. The MRI system of claim 11 wherein the RF coil assembly includes a phased-array coil architecture having four RF coils.

16. The MRI system of claim 15 wherein the phased-array coil architecture is a receive-only assembly.

17. A method of MR imaging comprising the steps of:
acquiring multiple channels of MR signals from a subject to be imaged;
frequency-division multiplexing the multiple channels of MR signals; and
transmitting the multiple channels of MR signals to a DAS across a single coaxial cable.

18. The method of claim 17 further comprising the step of transmitting In-phase and Quadrature components of an MR signal across separate coaxial cables to the DAS.

19. The method of claim 17 further comprising the step of transmitting multiple In-phase signals to the DAS across an I-channel coaxial cable, wherein each In-phase signal is centered at a unique frequency, and further comprising the step of transmitting multiple Quadrature signals to the DAS across a Q-channel coaxial cable, wherein each Quadrature signal is centered at a unique frequency.

20. The method of claim 17 further comprising the step of digitizing the multiple channels of MR signals into a single composite signal prior to the step of transmitting.

21. The method of claim 20 further comprising the step of using digital band filtering to recover individual channel information from the composite signal.

22. The method of claim 17 further comprising the step of acquiring the multiple channels of MR signals with a phased-array RF coil assembly.

* * * * *